United States Patent
Cornwell

(10) Patent No.: US 8,344,727 B2
(45) Date of Patent: Jan. 1, 2013

(54) DIRECTED ENERGY IMAGING SYSTEM

(75) Inventor: James Cornwell, Irvine, CA (US)

(73) Assignee: Kaonetics Technologies, Inc., Inyokem, CA (US)

(*) Notice: Subject to any disclaimer, the term of this patent is extended or adjusted under 35 U.S.C. 154(b) by 248 days.

(21) Appl. No.: 12/912,274

(22) Filed: Oct. 26, 2010

(65) Prior Publication Data

US 2011/0267058 A1   Nov. 3, 2011

Related U.S. Application Data

(63) Continuation of application No. 12/272,394, filed on Nov. 17, 2008, now Pat. No. 7,839,145.

(60) Provisional application No. 60/988,629, filed on Nov. 16, 2007, provisional application No. 61/113,847, filed on Nov. 12, 2008, provisional application No. 60/987,691, filed on Nov. 13, 2007.

(51) Int. Cl.
*G01V 3/00* (2006.01)

(52) U.S. Cl. ........................ 324/307; 324/309

(58) Field of Classification Search .......... 324/300–322; 600/407–445; 342/359; 250/288; 343/912
See application file for complete search history.

(56) References Cited

U.S. PATENT DOCUMENTS

| | | |
|---|---|---|
| 4,975,917 A | 12/1990 | Villa |
| 5,054,046 A | 10/1991 | Shoulders |
| 5,054,047 A | 10/1991 | Shoulders |
| 5,365,927 A | 11/1994 | Roemer |
| 5,594,296 A | 1/1997 | Mitsutake et al. |
| 5,682,412 A | 10/1997 | Skillicorn et al. |
| 5,912,469 A | 6/1999 | Okino |
| 6,124,596 A | 9/2000 | Nakasuii |
| 6,314,380 B1 | 11/2001 | Seip et al. |
| 6,567,685 B2 | 5/2003 | Takamori |
| 6,649,907 B2 | 11/2003 | Ebeling et al. |
| 6,657,594 B2 | 12/2003 | Anderson |
| 6,756,930 B1 | 6/2004 | Nunuparov et al. |
| 6,784,408 B1 | 8/2004 | Cheung et al. |

(Continued)

FOREIGN PATENT DOCUMENTS

CN   2155600   2/1994

(Continued)

OTHER PUBLICATIONS

Supplementary Search Report issued on Apr. 8, 2011 in European Patent Appln. No. 08850425.3.

(Continued)

*Primary Examiner* — Brij Shrivastav

(74) *Attorney, Agent, or Firm* — Steven R. Vosen

(57) ABSTRACT

An imaging system that uses a directed-energy device can include a directed-energy device configured to generate an excitation signal to impinge a region of interest of a target and excite elements therein and receive resonance signals emitted from the region of interest of the target after the excitation signal is terminated. The directed-energy device can include a charged particle generator configured to generate plural energized particles and a charge transformer configured to receive the plural energized particles that include charged particles from the charged particle generator and to output a wavefront including energized particles that include particles having substantially zero charge. The imaging system can also include plural gradient coils positioned about a bore of a magnet and configured to impress a polarizing magnetic field on a target and a communications interface.

20 Claims, 3 Drawing Sheets

U.S. PATENT DOCUMENTS

| | | | |
|---|---|---|---|
| 6,809,307 | B2 | 10/2004 | Byren et al. |
| 6,849,841 | B2 | 2/2005 | Byren et al. |
| 6,864,825 | B2 | 3/2005 | Holly |
| 6,971,391 | B1 * | 12/2005 | Wang et al. ............... 128/846 |
| 7,061,241 | B2 | 6/2006 | Le Roux |
| 7,098,662 | B2 | 8/2006 | Hinks et al. |
| 7,126,530 | B2 | 10/2006 | Brown |
| 7,221,329 | B2 | 5/2007 | Cornwell |
| 7,439,497 | B2 * | 10/2008 | Dantus et al. ............ 250/288 |
| 7,518,108 | B2 | 4/2009 | Frey et al. |
| 7,633,293 | B2 * | 12/2009 | Olson et al. ............. 324/318 |
| 7,839,145 | B2 * | 11/2010 | Cornwell ................. 324/307 |
| 7,924,006 | B2 * | 4/2011 | Kuge ...................... 324/309 |
| 2003/0179784 | A1 | 9/2003 | Minehara et al. |
| 2007/0259641 | A1 | 11/2007 | Gorrell et al. |
| 2007/0273244 | A1 | 11/2007 | Lal et al. |
| 2008/0170982 | A1 | 7/2008 | Zhang et al. |
| 2009/0121839 | A1 | 5/2009 | Cornwell |
| 2009/0123163 | A1 | 5/2009 | Cornwell |
| 2009/0124217 | A1 | 5/2009 | Cornwell |
| 2009/0309015 | A1 | 12/2009 | Schultz et al. |
| 2010/0085684 | A1 | 4/2010 | Suh et al. |
| 2012/0062230 | A1 * | 3/2012 | Vaughan et al. ........ 324/318 |
| 2012/0190964 | A1 * | 7/2012 | Hyde et al. ............. 600/407 |

FOREIGN PATENT DOCUMENTS

| | | |
|---|---|---|
| EP | 1372104 | 12/2003 |
| GB | 2429592 | 2/2007 |
| JP | 07-235257 | 9/1995 |
| WO | WO 2006/086658 | 8/2006 |
| WO | WO 2009/064397 | 5/2009 |

OTHER PUBLICATIONS

Notification of Transmittal of the International Search Report and the Written Opinion of the International Searching Authority (Forms PCT/ISAI220, PCT/ISAI210 and PCT/ISAI237) from International Application No. PCT/US2008/012831 dated Feb. 19, 2009 corresponding to U.S. Appl. No. 12/271,682.

International Search Report and Written Opinion dated May 19, 2009 from International Application No. PCT/US2008/012673 corresponding to U.S. Appl. No. 12/269,880.

International Search Report and Written Opinion dated May 29, 2009 from International Application No. PCT/US2008/012843 corresponding to U.S. Appl. No. 12/272,394.

International Search Report and Written Opinion dated May 25, 2009 from International Application No. PCT/US2008/012678 corresponding to U.S. Appl. No. 12/269,876.

International Search Report and Written Opinion dated Jun. 11, 2009 from International Application No. PCT/US2008/012672 corresponding to U.S. Appl. No. 12/269,878.

* cited by examiner

DIRECTED ENERGY IMAGING SYSTEM

CROSS-REFERENCE TO RELATED APPLICATIONS

This application is a continuation of United States Patent Application No. 12/272,394, filed on Nov. 17, 2008, now U.S. Pat. No.7,839,145 entitled "DIRECTED-ENERGY IMAGING SYSTEM", the entire disclosure of which is incorporated herein by reference.

This application claims priority from U.S. Provisional Patent Application Ser. No. 60/988,629, filed Nov. 16, 2007, the disclosure of which is hereby incorporated by reference in its entirety. This application also incorporates by reference in their entirety U.S. Provisional Patent Application Ser. Nos. 61/113,847, filed Nov. 12, 2008, and 60/987,691, filed Nov. 13, 2007.

PCT International Pub. No. WO2006/086658 titled "Antenna System," which is a continuation of International Application Number PCT/US2006/004779, filed Feb. 13, 2006, is incorporated by reference herein in its entirety. U.S. Pat. No. 7,221,329 titled "Enhanced Beam Antenna," dated May 22, 2007, is also incorporated by reference herein in its entirety.

BACKGROUND

1. Field

The subject mater presented herein relates generally to imaging devices and methods, and more particularly, to an imaging system that uses a directed-energy device.

2. Description of Related Art

U.S. Pat. Nos. 7,098,662 and 7,061,241, for example, can be used as references to illustrate principles of known Magnetic Resonance Imaging (MRI) systems and their disclosures are incorporated herein by reference in their entirety.

In the static magnetic fields commonly used in known magnetic resonance imaging (MRI), the energy difference between the nuclear spin states can correspond to a photon at radio frequency (RF) wavelengths. Resonant absorption of energy by the protons due to an external oscillating magnetic field can occur at what is referred to as the Larmor frequency for the particular nucleus.

A practical value of this phenomenon resides in the signal emitted by the excited spins after an excitation signal is terminated. The emitted signal can be a function of at least one and typically several physical properties of the spin that generates the signal and therefore, by examining the emitted signal, the properties of the spin can be determined. If the region of interest of a target (human tissue), is subjected to a separate magnetic field which is in the x-y plane and which is near the Larmor frequency, the net aligned moment, or "longitudinal magnetization" may be rotated, or "tipped" to produce a net transverse magnetic moment. A signal can be emitted by the excited spins after the excitation signal is terminated. In known MRI systems, the emitted magnetic resonance signals can be acquired, digitized and processed to generate a magnetic resonance data set that can be used to produce an image of the target, typically a two dimensional cross section or slice.

Known MRI systems can typically includes a plurality of gradient coils positioned about a bore of a magnet to impress a polarizing magnetic field and an RF transceiver system with an RF switch controlled by a pulse module to transmit RF signals to an RF coil assembly, i.e., antenna, and to acquire the magnetic resonance signals emitted by the region of interest within the target.

As further background, the configuration and operation of directed energy devices varies widely as is illustrated by the disclosures within U.S. Pat. Nos. 6,809,307; 6,784,408; 6,849,841; 6,864,825 and 7,126,530, which are incorporated herein by reference in their entirety.

SUMMARY

In an exemplary embodiment, a directed-energy device configured to generate an excitation signal to impinge a region of interest of a target and excite elements therein and receive resonance signals emitted from the region of interest of the target after the excitation signal is terminated can comprise a charged particle generator configured to generate plural energized particles; and a charge transformer configured to receive the plural energized particles that include charged particles from the charged particle generator and to output a wavefront including energized particles that include particles having substantially zero charge; plural gradient coils positioned about a bore of a magnet and configured to impress a polarizing magnetic field on a target; and a communications interface configured to transfer the received resonance signals to a processor configured to produce an image of the region of interest of the target based on the received signals.

In another exemplary embodiment, a method of using a directed-energy device as an imaging system can comprise generating a wavefront that includes particles at substantially zero charge to impinge a target; terminating the wavefront to permit particles within the target to release absorbed energy, return to their previous alignments and emit a signal receiving the emitted signal; processing the received signal; and producing an image of the target area based on the received signal.

BRIEF DESCRIPTION OF THE DRAWINGS

As will be realized, different embodiments are possible, and the details disclosed herein are capable of modification in various respects, all without departing from the scope of the claims. Accordingly, the drawings and descriptions are to be regarded as illustrative in nature and not as restrictive. Like reference numerals have been used to designate like elements.

DETAILED DESCRIPTION

Figure 1:
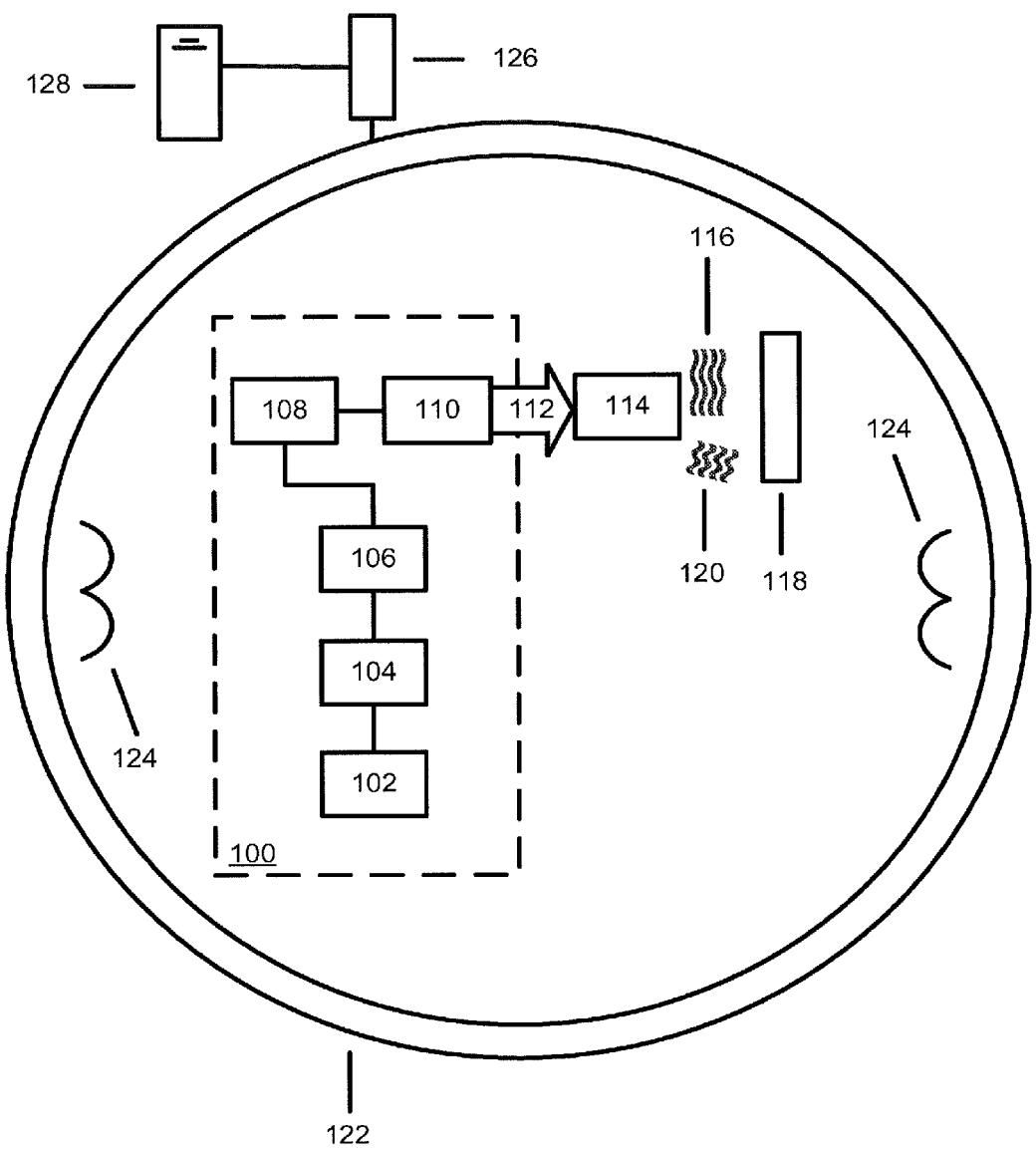
FIG. 1 shows a functional block diagram of an exemplary embodiment of a directed-energy device used in an imaging system.
Figure 2:
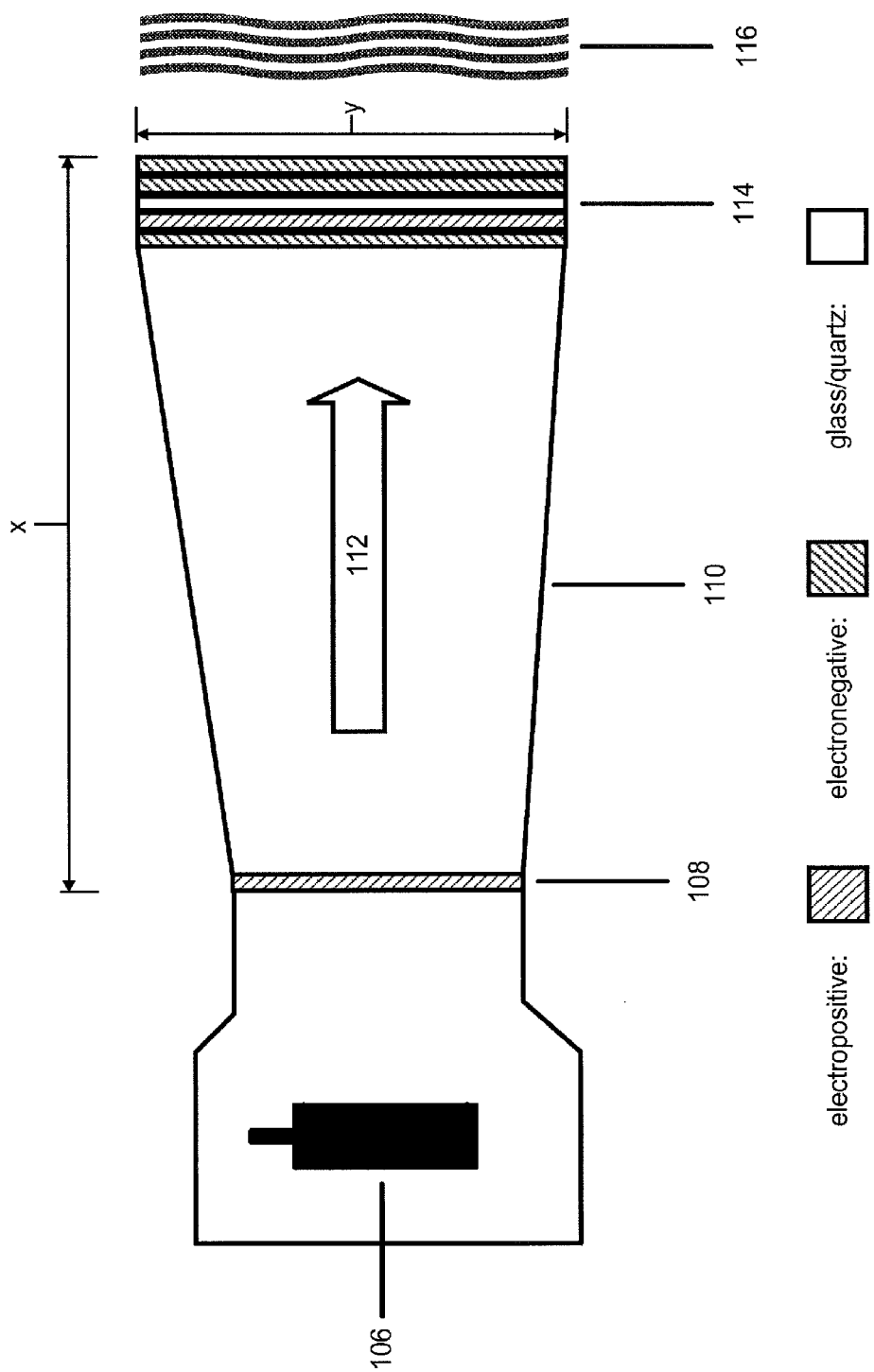
FIG. 2 shows a simplified cross-sectional view of portions of an exemplary embodiment of directed-energy device used in an imaging system.

Referring to FIGS. 1 and 2, an exemplary embodiment of a directed-energy imaging system can include a charged particle generator 100 configured to generate plural energized particles and a charge transformer 114 configured to receive the plural energized particles that include charged particles from the charged particle generator and to output a wavefront 116 including energized particles that include particles having substantially zero charge. The charged particle generator 100 can be configured to direct the plural energized particles through the charge transformer 114 to propagate through free space until impinging on a target area 118 in, for example, a subject in an MRI device 122.

In an exemplary embodiment, the presence of wavefront 116 at target area 118 can have an excitation effect similar to that produced by the RF system in a known MRI device. For example, elements containing, e.g., protons, in the target area can absorb energy from the wavefront. When the wavefront energy stops, the protons can release the absorbed energy, return to their previous alignments and, in so doing, emit a signal 120, which can be received by a known communications/detector interface 116 capable of detecting the signal emitted by the excited spins after the excitation signal is terminated, and processed by a processor 128 to produce an image of the target area 118, as explained above.

In an exemplary embodiment, plural gradient coils 124 can be positioned about a bore of a magnet in MRI device 122 to impress a polarizing magnetic field. Gradient coils 124 can be used to spatially encode the positions of protons by varying the magnetic field linearly across the imaging volume. The Larmor frequency can then vary as a function of position in the x, y and z-axes. Gradient coils can be resistive electromagnets powered by amplifiers that can permit adjustments to their field strength and direction.

In an exemplary embodiment, a communications/detector interface 126 can be configured to transfer the received resonance signals emitted from the region of interest of the target after the excitation signal is terminated to a processor 128 configured to produce an image of the region of interest of the target based on the received signals using known image processing methods.

In an exemplary embodiment, the emitted signal 120 from the target area 118 can be alternatively or additionally received by waveguide 110 in the charged particle generator 100, which can essentially operate in reverse when receiving the emitted signal in the form of a reflected and/or attenuated zero charge wavefront. However, the target area 118 can generate, in response to the substantially zero charge wavefront 116, a signal of a different nature, e.g., an electromagnetic signal, such as an RF signal, microwave signal or visible wavelength signal, to name a few, which can be received and processed using known methods.

In an exemplary embodiment, the plural energized particles 112 can be in the form of a photon particle wave, e.g., a mixture or cross-generation of photons and electrons.

Power and control components will be known to those of skill in the art. For example, in an exemplary embodiment, energized particle generator 100 can include a DC power supply 102 and DC-to-AC converter 104.

In an exemplary embodiment, charged particle generator 100 can include charged particle emitter 106. In an embodiment, charged particle emitter 106 can include any source of radio frequency energy, including microwaves. In some embodiments, charged particle emitter 106 may include known magnetrons. In some other embodiments, charged particle emitter 106 may include solid-state power amplifiers, gyrotrons, traveling wave tubes (TWTs), and/or klystrons. In some embodiments, charged particle emitter 106 may be a lower-power source and may generate energy levels of approximately 1 kilowatt (kW) to approximately 100 kW or greater, although the scope is not limited in this respect.

In an exemplary embodiment, in charged particle emitter 106, an RF signal can be formed using known techniques. The RF signal can be combined with an excitation signal, which can form a modulated photon wave. In an embodiment, the RF signal can be transmitted to a plurality of directional antenna devices, for example, which may be included in waveguide 110. By the amplification of the RF signal to a very high signal voltage and subsequent application of this amplified RF signal to the directional antenna devices, an ionic discharge at the antennas can occur that can transform the RF signal into a directed particle beam including plural energized particles.

In an embodiment, waveguide 110 can be configured to minimize backscatter of the energized particles using known techniques. For example, using a plurality of backscatter reflectors, which can be included in waveguide 110 in proximity to the directional antennas, the particle beam can then be further focused and directed via waveguide 110 as an electromagnetic wavefront 112 to impinge on the surface of charge transformer 114.

Without limiting the scope of the invention, other examples of suitable charged particle emitters that can form a photon particle wave include known energy emission devices such as free electron lasers and discharges or arcs at edges of planar antennae, for example, spark gap generators.

In some embodiments, charged particle emitter 106 may include a free electron laser, or FEL. A FEL is a laser that shares the same optical properties as conventional lasers such as emitting a beam consisting of coherent electromagnetic radiation which can reach high power, but which uses some very different operating principles to form the beam. Unlike gas, liquid, or solid-state lasers such as diode lasers, which rely on bound atomic or molecular states, FELs use a relativistic electron beam as the lasing medium, hence the term free electron. This gives them a wide frequency range compared to other laser types, and makes many of them widely tunable, currently ranging in wavelength from microwaves, through terahertz radiation and infrared, to the visible spectrum, to ultraviolet, to soft X-rays.

In an exemplary embodiment, charged particle emitter 106 can include an excitation signal, produced by known signal generation devices, for example. Such an excitation signal could be a 120 VAC clipped (square) wave that can have an effect of driving a magnetron outside of a typical 2.45 GHz frequency, for example. In an embodiment, when a 120 VAC square wave excitation signal is applied to a magnetron, bandwidths on the order of 0 to 10 GHz can be achieved.

In an exemplary embodiment, the output of charged particle emitter 106 can be a photon particle wave that can include a mixture of photons and electrons.

In an exemplary embodiment, charged particle generator 100 can include an energized particle, e.g., photon and/or particle beam or wave, forming module 108. In an exemplary embodiment, energized particle (photon particle beam or wave) forming module 108 can be positioned in a throat section of a waveguide launcher between charged particle emitter 106 and waveguide 110.

In an exemplary embodiment, energized particle forming module 108 can be made of an electropositive material, such as a polycarbonate sheet. In an embodiment, this material can include DELRIN manufactured by DuPont. In an embodiment, energized particle forming module 108 can act like a roughing filter, i.e., it can start the process of reducing the charge of the charged particles in the mixture of photons and electrons. After passing through energized particle forming module 108, the mixture of photons and electrons can then be directed via waveguide 110 as an electromagnetic wavefront 112 to impinge on the surface of charge transformer 114.

In an exemplary embodiment, waveguide 110 can include a hollow conducting tube, which may be rectangular or circular, for example, within which EM waves can be propagated. Signals can propagate within the confines of metallic walls, for example, that act as boundaries.

In an exemplary embodiment, waveguide 110 can be configured as a circularly polarized antenna and may radiate substantially circularly polarized energy. In other embodiments, waveguide 110 may be linearly polarized and may radiate signals with a linear polarization (e.g., a horizontal and/or a vertical polarization). Antennas in many shapes, such as horns, lenses, planar arrays, and reflectors may be suitable in some of these embodiments.

As shown in FIG. 2, exemplary waveguide 110 can be configured as part of a device that can include a magnetron portion, a throat section of a waveguide launcher area that can include energized particle forming module 108 positioned between charged particle emitter 106 and waveguide 110, and a cone-like portion or horn. In an exemplary embodiment, a magnetron can be placed in the magnetron portion such that there can be a three-inch gap between the top of the magnetron's cathode and the top of the enclosure.

In an exemplary and non-limiting embodiment, waveguide 110 can be designed to promote sufficient velocity of the photon particle wave that can include a mixture of photons and electrons particles, here designated as EM wavefront 112, moving through the waveguide 110. Again referring to FIG. 2, x refers to a length of exemplary waveguide 110 (which can include energized particle forming module 108) and y refers to a height of an aperture opening at the end of waveguide 110. In an exemplary embodiment, the ratio of x/y can be approximately 3 to 3.5 to 1 to promote sufficient velocity of the particles moving through the waveguide 110. For example, assuming that the aperture opening height (y) is six inches, then waveguide 110 length can be from 18 to 21 inches. In another embodiment, a length of waveguide 110 can be based on the ratio of six times the air gap above an exemplary magnetron's cathode. Using the previously mentioned three-inch gap, this results in a waveguide length of eighteen inches.

In an exemplary embodiment, the aperture opening can be generally rectangular. In an embodiment, the aperture opening width can be eight inches for an aperture opening height (y) of six inches. In an exemplary embodiment, the length of the launcher area before the waveguide 110 can be approximately two inches.

In an exemplary embodiment, the interior surface of exemplary waveguide 110 can be coated with approximately two mils (0.002 inches) of a noble metal, such as 14-carat gold, for example. Other noble metals can include ruthenium, rhodium, palladium, osmium, iridium and platinum. Such a coating can improve the gain characteristics of waveguide 110. An example of a suitable coating process that can be used to enhance the performance of antennas or waveguides may be found in U.S. Pat. No. 7,221,329, the disclosure of which is hereby incorporated by reference in its entirety.

In an exemplary embodiment, EM wavefront 112 can be directed through charge transformer 114. In an embodiment, charge transformer 112 can have dielectric and physical characteristics such that the energized charged particles, e.g., electrons, in an EM wavefront 112 can be transformed. While not wishing to be bound by any particular theory, this may be done either by changing characteristics of the particle, or by generation or emission of different particles as a result thereof, thereby creating a wavefront 116 at the output of the charge transformer 114. Wavefront 116 can have the modulation properties of the original RF signal and propagate through free space until impinging on target area 118.

In an exemplary embodiment, a 600 W magnetron can produce a wavefront 116 of about 10 mW/cm2 at the aperture, which can result in about 2 mW/cm2 at 1 meter from the aperture.

In an exemplary embodiment, charge transformer 114 can include an incident surface for receiving the EM wavefront 112 and an exit surface for radiating the wavefront 116.

In an exemplary embodiment, charge transformer 114 can include a composite of glass and/or polycarbonate materials, for example, and can vary in shape. For example, flat plates or panes with parallel surfaces can be used as well as convex lenses of a desired focal length. Hybrid configurations with parallel surfaces at the center and convex surfaces at the edges can also be acceptable configurations.

Referring to FIG. 2, in an exemplary embodiment, charge transformer 114 can include at least one electronegative/electropositive material pair, i.e., an electronegative layer next to an electropositive layer, or vice versa, that first receives EM wavefront 112, followed by approximately ½ inch of glass or quartz, followed by two electronegative layers. In an exemplary embodiment, this assembly of layers can be vacuum-sealed in ABS plastic.

Suitable materials for the electronegative/electropositive material pair can include known materials that can exhibit electronegative/electropositive behavior. As previously mentioned, an electropositive material can include a polycarbonate sheet made of DELRIN, for example. Suitable polycarbonate can also be chosen for electronegative layers. In another embodiment, plate glass can be sputtered with metal oxides to achieve desired electronegative/electropositive behavior.

In an exemplary embodiment, the approximately ½ inch of glass layer can include leaded glass if additional dampening of the emitted zero-charge particle stream is desired.

In an exemplary embodiment, there can be plural pairs of electronegative/electropositive material that first receives EM wavefront 112 followed by a glass or quartz layer.

In an exemplary embodiment, horizontal and/or vertical slits or other openings can be formed into or cut out of charge transformer 114 so that in addition to wavefront 116 propagating from charge transformer 114, charged particles in EM wavefront 112 can also propagate from the device. A controlled amount of charged particles along with wavefront 116 may be useful depending on the operating environment. In an exemplary embodiment, the slits or other openings may be adjustable by an operator using known methods and/or materials. For example, tape, a slide mechanism, or an aperture mechanism could be used to adjust the slits.

Charge transformer 114 may incorporate known coating materials or multiple deposition layers on either the incident surface or the exit surface to aid in the wavefront 116 generation, and/or have abrasion or polishing performed on either surface to enhance desired characteristics of the charge transformer 114. Similarly, side surfaces may have similar operations performed to enhance the desired charge transformer 114 characteristics. Other compositions materials and combinations of materials may be used in the fabrication of the charge transformer 114 to achieve desired transformation effects. Additionally, other geometries may be used for charge transformer 114, including, without limitation, stacking additional charge transformer components in combinations that may reflect, refract or redirect EM wavefront 112.

In an exemplary embodiment, wavefront 116, after exiting charge transformer 114, is shown in FIG. 1 propagating through free space until impinging a target area 118 in, for example, a subject in an MRI device. As discussed, the presence of wavefront 116 at target area 118 can have an effect similar to that produced by the RF system in a known MRI device.

In an exemplary embodiment, a sighting device, such as a laser, rifle scope or gun sight, can be incorporated into an exemplary directed-energy device 101 and used to help direct the wavefront 116.

Transforming the plural energized particles within the charge transformer can include laterally aligning the plural energized particles to produce a polarization of the plural energized particles. The plural energized particles can be generated by cross-generation of photons and electrons.

Various system components described above may be resized depending on the system parameters desired. For example, charge transformer 114 and waveguide 110 can be made larger or smaller and can have different dimensions and geometries depending, for example, on the power or distance requirements of a particular application. Additionally, an exemplary charged particle emitter 106 may be configured by those skilled in the art to have multiple voltages, frequencies, and power levels.

The precise theory of operation of the charged particle generator 100 in combination with the charge transformer 114 is not entirely understood. Without wishing to be bound by any theory, it is believed that the charge transformer 114 reduces the charge in the EM wavefront 112. Based on empirical data to date, it has been determined through experimentation, using, for example, exemplary embodiments described herein, that the particles in wavefront 116 are at a zero-charge state and approximately the same mass as an electron ($9.10938188 \times 10^{-31}$ kilograms).

While reiterating that the precise theory of operation is not entirely understood, it is believed that the effect is such that when a wavefront of exemplary zero-charge particles with sufficient energy density impinges an object, for example, the kinetic energy of the particles, rather than an associated electromagnetic charge, can cause a resonant frequency. This resonant frequency may cause mechanical or physical oscillations.

In an exemplary embodiment, directional planar antennas, as described in the referenced PCT International Pub. No. WO2006/086658 titled "Antenna System," can be used to create and focus a directed particle beam, thereby enhancing signal carrier performance. A brief description of an example of one such antenna will be described to aid in the understanding of the embodiments disclosed herein.

Typically, an antenna can include a first insulating substrate extending in the principal plane of the antenna. The antenna can further include a first radiating element and a connected first conductor and can include a second radiating element and a connected second conductor. The antenna can further include a coupling conductor coupling the second radiating element and the first conductor. The first antenna can further include a first coupler having a first signal conductor and a second signal conductor. The first signal conductor can be coupled to the second conductor, and the second signal conductor can be coupled to the first radiating element.

In an exemplary embodiment, when RF signal currents are applied between the first and second signal conductors, radiating elements can resonate and operate as an antenna. The radiation that emanates from a radiating element can tend to emanate from the edge of the element, e.g., the edge of an etched copper, generally flat, shape. By incorporating a plurality of such antennas, each having a different principal plane or orientation, and where each may have a custom configuration, a composite radiation field pattern can be shaped and made highly directional. Each antenna configuration may be varied by size and shape to meet frequency requirements and impedance matching requirements according to known "patch radiator" technology. Such directional radiation effects can be incorporated in the embodiments disclosed herein.

Figure 3:
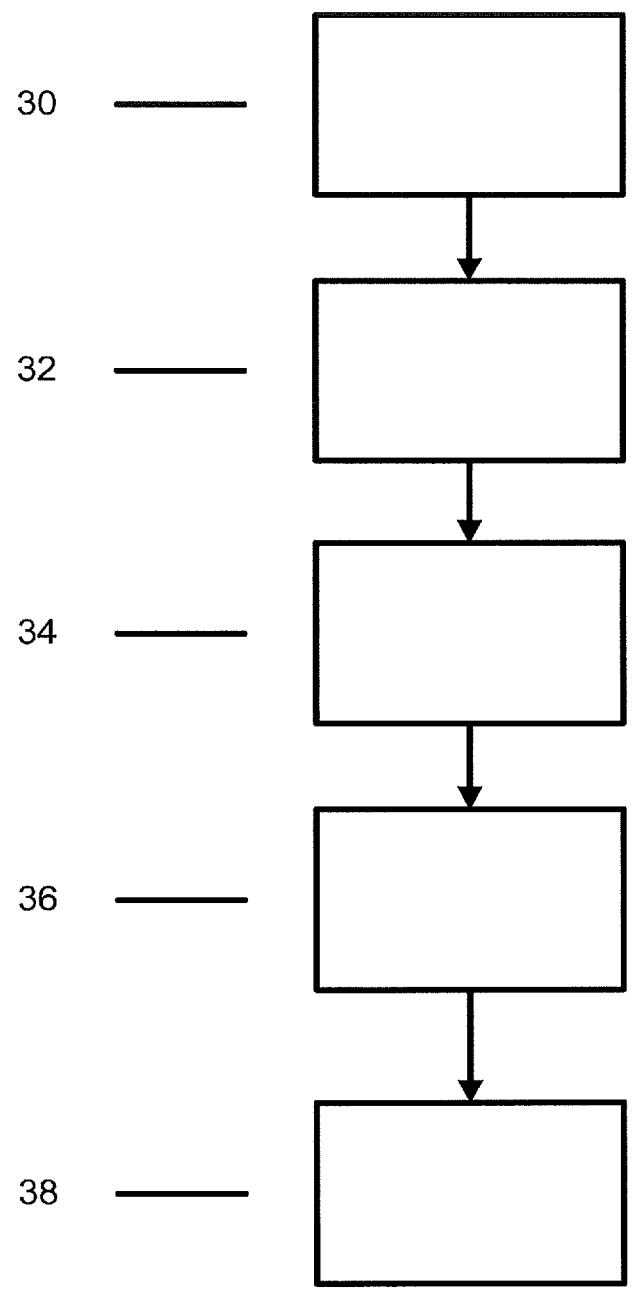
FIG. 3 shows a flow chart for an exemplary method using an exemplary embodiment of a directed-energy device used in an imaging system.

Referring to FIG. 3, an exemplary method of using directed-energy imaging system can include generating a wavefront that includes particles at substantially zero charge to impinge a target in step 30; terminating the wavefront to permit particles, e.g., protons, within the target area to release absorbed energy, return to their previous alignments and emit a signal, e.g., a resonance signal, in step 32; receiving the emitted signal in step 34; processing the emitted signal, in step 36; and producing an image of the target area, in step 38.

Generating a wavefront that includes particles at substantially zero charge to impinge a target in step can include combining an RF signal with an excitation signal to produce a modulated signal; generating a modulated photon wave associated with the modulated signal, the modulated photon wave including plural energized particles; directing the modulated photon wave to an incident surface of an charge transformer; transforming the plural energized particles within the charge transformer, wherein the transformed particles are at substantially zero charge; and generating a wavefront at an exit surface of the charge transformer that includes the transformed particles at substantially zero charge.

In an exemplary embodiment, the combining step of generating a wavefront may take the form of superimposing the RF signal upon a signal composed of a square wave riding on a DC voltage level. The modulated photon wave generating step 34 may use, without limiting the scope of the invention, a magnetron as is known in the art or other energy emission device, such as discharges or arcs at edges of planar antennae.

In an exemplary embodiment, transforming the modulated photon wave within the charge transformer can include laterally aligning the photons in the modulated photon wave to produce a polarization of that modulated photon wave. This can be accomplished, for example, by manipulating electron speed of the photons, i.e. slowing the electron speeds to release energy in the form of the broadband wavefront. By controlling the design parameters of the charge transformer (e.g., thickness, composition, doping, incident angle of impingement, etc.), desired communication characteristics may be enhanced.

The broadband wavefront 116 can behave in a manner that can be described by particle quantum physics rather than by typical communications theory, and can be characterized as being relatively immune to traditional RF interference. By controlling the configuration and material characteristics of charge transformer 114, the wavefront 116 of the transformed EM radiation 112 can be modified and enhanced based on desired operational characteristics.

In an exemplary embodiment of a directed-energy imaging system, a zero-charge wavefront as an excitation wave can be focused and can be of high enough energy to provide responses from a target distinct from known magnetic resonance emissions in response to the RF radiation of known MRI systems.

The apparatus and methods disclosed herein can provide for imaging three-dimensional targets, for example, of various sizes and compositions using a zero-charge wavefront from a directed energy device. The frequency of the wavefront can be varied to include frequencies within or outside of typical RF frequencies, and can be used in a manner consistent with the excitation energy employed in known imaging techniques, such as the radio frequencies used in magnetic resonance imaging.

The above description is presented to enable a person skilled in the art to make and use the systems and methods described herein, and is provided in the context of a particular application and its requirements. Various modifications to the embodiments will be readily apparent to those skilled in the art, and the generic principles defined herein may be applied to other embodiments and applications without departing from the spirit and scope of the claims. Thus, there is no intention to be limited to the embodiments shown, but rather to be accorded the widest scope consistent with the principles and features disclosed herein.

What is claimed is:

1. An imaging system, comprising:
    a directed-energy device configured to generate an excitation signal to impinge a region of interest of a target and excite elements therein to induce resonance signals emitted from the region of interest of the target after the excitation signal is terminated, comprising:
        a charged particle generator configured to generate plural energized particles;
        an excitation signal generator configured to generate an excitation signal to control the output of the charged particle generator; and
        a charge transformer configured to receive the plural energized particles from the charged particle generator and to output a wavefront including energized particles that include particles having substantially zero charge;
    plural gradient coils positioned about a bore of a magnet and configured to impress a polarizing magnetic field on the target; and
    a communications interface configured to transfer the received resonance signals emitted from the region of interest of the target after the excitation signal is terminated to a processor configured to produce an image of the region of interest of the target based on the received signals.

2. The imaging system according to claim 1, wherein the charged particle emitter comprises:
    at least one of a magnetron, solid-state power amplifier, gyrotron, traveling wave tube, klystron and free electron laser.

3. The imaging system according to claim 2, wherein the excitation signal from the excitation signal generator and supplied to the charged particle generator comprises a 120 VAC square wave.

4. The imaging system according to claim 2, wherein the plural energized particles comprise a photon particle wave.

5. The imaging system according to claim 2, wherein the charged particle generator comprises:
    an energized particle-forming module.

6. The imaging system according to claim 5, wherein the energized particle-forming module comprises:
    an electropositive material.

7. The imaging system according to claim 6, wherein the electropositive material comprises:
    polycarbonate.

8. The imaging system according to claim 2, wherein the imaging system comprises:
    a waveguide.

9. The imaging system according to claim 8, wherein a ratio of a length of the waveguide to a height of an aperture opening at an end of the waveguide is in the range of about 3 to about 3.5 to 1.

10. The imaging system according to any one of claim 8, wherein an interior surface of the waveguide comprises:
    a coating of a noble metal.

11. The imaging system according to any one of claim 8, wherein the waveguide comprises:
    a horn antenna.

12. The imaging system according to claim 2, wherein the charge transformer comprises:
    at least one pair of electronegative and electropositive material.

13. The imaging system according to claim 12, wherein the charge transformer comprises at least one of polycarbonate and Delrin.

14. The imaging system according to any one of claims 12, wherein the charge transformer comprises:
    a layer comprising at least one of glass and quartz adjacent to the at least one pair of electronegative and electropositive material.

15. The imaging system according to claim 2, wherein the charge transformer comprises:
    one or more openings therethrough.

16. The imaging system according to claim 2, further comprising:
    one or more antennas configured to minimize backscatter.

17. The imaging system according to claim 2, further comprising a waveguide, wherein the waveguide comprises:
    one or more antennas configured to be circularly polarized and radiate substantially circularly polarized energy.

18. The imaging system according to claim 2, wherein the charged particle generator is configured to generate plural energized particles and a photon particle wave at power levels of approximately 1 kilowatt (kW) to approximately 100 kW.

19. A method of using a directed-energy device as an imaging system comprising:
    providing a directed energy device configured to output a wavefront including energized particles that include particles having substantially zero charge, the directed energy device comprising at least one of a magnetron, solid-state power amplifier, gyrotron, traveling wave tube, klystron and free electron laser;
    generating a wavefront that includes particles at substantially zero charge to impinge a target;
    terminating the impingement of the wavefront on the target to permit particles within the target to release absorbed energy, return to their previous alignments and emit a signal;
    receiving the emitted signal;
    processing the received signal; and
    producing an image of the target area based on the received signal.

20. The method according to claim 19, wherein generating the wavefront that includes particles at substantially zero charge comprises:
    generating an RF signal;
    combining the RF signal with an excitation signal to produce a modulated signal;
    generating a modulated photon wave associated with the modulated signal, the modulated photon wave including plural energized particles;
    directing the modulated photon wave to an incident surface of a charge transformer; and
    emitting a wavefront at an exit surface of the charge transformer that includes the transformed particles at substantially zero charge.

* * * * *